US006379223B1

(12) United States Patent
Sun et al.

(10) Patent No.: US 6,379,223 B1
(45) Date of Patent: Apr. 30, 2002

(54) METHOD AND APPARATUS FOR ELECTROCHEMICAL-MECHANICAL PLANARIZATION

(75) Inventors: Lizhong Sun, Sunnyvale; Stan D. Tsai; Fred C. Redeker, both of Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/450,937

(22) Filed: Nov. 29, 1999

(51) Int. Cl.$^7$ .................................................. B24B 1/00
(52) U.S. Cl. ......................................... 451/41; 451/287
(58) Field of Search ........................... 451/41, 63, 287, 451/288, 289, 397, 398

(56) References Cited

U.S. PATENT DOCUMENTS

| | | |
|---|---|---|
| 4,466,864 A | 8/1984 | Bacon, et al. |
| 4,496,436 A | 1/1985 | Inoue |
| 4,789,437 A | 12/1988 | Sing, et al. |
| 4,839,005 A | 6/1989 | Katsumoto et al. |
| 4,869,971 A | 9/1989 | Nee, et al. |
| 4,956,056 A | 9/1990 | Zubatova et al. |
| 5,032,238 A | 7/1991 | Ishimura et al. |
| 5,039,381 A | 8/1991 | Mullarkey |
| 5,096,550 A | 3/1992 | Mayer, et al. |
| 5,114,548 A | 5/1992 | Rhoades |
| 5,141,602 A | 8/1992 | Chen, et al. |
| 5,217,586 A | 6/1993 | Datta, et al. |
| 5,256,565 A | 10/1993 | Bernhardt, et al. |
| 5,340,370 A | 8/1994 | Cadien et al. |
| 5,522,965 A | 6/1996 | Chisholm et al. |
| 5,637,031 A | 6/1997 | Chen |
| 5,637,185 A | * 6/1997 | Murarka et al. ............... 438/5 |
| 5,664,990 A | 9/1997 | Adams et al. |
| 5,683,538 A | 11/1997 | O'Neill, et al. |

(List continued on next page.)

FOREIGN PATENT DOCUMENTS

| | | | |
|---|---|---|---|
| JP | 53-037543 | 4/1978 | |
| WO | Wo 99/26758 | 6/1999 | ............. B24B/1/00 |
| WO | WO 99/54527 | 10/1999 | |
| WO | WO 00/26443 | 5/2000 | |
| WO | WO 00/59682 | 10/2000 | |

OTHER PUBLICATIONS

C. Yu, et al., Appl. Phys. Let, "Dishing effects in a chemical mechanical polishing planarization process for advanced trench isolation", Sep. 14, 1992, pp. 1344–1346.

U.S. Patent Application Serial No. 09/450,858, filed on Nov. 29, 1999, 30 pages.

Eurpoean Search Report from EP 00 31 0358, Dated Oct. 10, 2001.

09/569,883 Gandikota, et al.

09/289,074 Dordi, et al.

09/245,780 Dordi, et al.

Primary Examiner—Timothy V. Eley
Assistant Examiner—Dung Van Nguyen
(74) Attorney, Agent, or Firm—Moser, Patterson & Sheridan

(57) ABSTRACT

A method for performing electrochemical-mechanical planarization (EMP) of a workpiece surface including a pattern of electrical conductors comprises supplying a chemical-mechanical polishing (CMP)-type apparatus having an abrasive or non-abrasive polishing pad with an oxidizer-free, electrolytically conductive, abrasive or non-abrasive fluid and applying a time-varying anodic potential to the workpiece surface for controllably dissolving the material, e.g., metal, of the electrical conductors while simultaneously applying mechanical polishing action to the surface. The method advantageously reduces or substantially eliminates undesirable dishing characteristic of conventional CMP planarization processing utilizing chemical oxidizer agent(s). Apparatus for performing EMP are also disclosed.

5 Claims, 5 Drawing Sheets

U.S. PATENT DOCUMENTS

| | | |
|---|---|---|
| 5,705,230 A | 1/1998 | Manatabe, et al. |
| 5,738,574 A | 4/1998 | Tolles, et al. |
| 5,807,165 A | 9/1998 | Uzoh, et al. |
| 5,827,435 A | 10/1998 | Samukawa |
| 5,911,619 A * | 6/1999 | Uzoh et al. .................... 451/5 |
| 5,972,192 A | 10/1999 | Dubin, et al. |
| 6,004,880 A | 12/1999 | Liu, et al. |
| 6,010,964 A * | 1/2000 | Glass .......................... 438/692 |
| 6,027,630 A | 2/2000 | Cohen |
| 6,056,864 A | 5/2000 | Cheung |
| 6,066,030 A * | 5/2000 | Uzoh .......................... 451/41 |
| 6,090,239 A | 7/2000 | Liu, et al. |
| 6,143,155 A | 11/2000 | Adams et al. |
| 6,176,992 B1 | 1/2001 | Talieh |
| 6,203,684 B1 | 3/2001 | Taylor, et al. |
| 6,261,433 B1 | 7/2001 | Landau |

METHOD AND APPARATUS FOR ELECTROCHEMICAL-MECHANICAL PLANARIZATION

CROSS-REFERENCE TO RELATED APPLICATION

This application contains subject matter related to subject matter disclosed in co-pending U.S. patent application Ser. No. 09/450,858, filed on Nov. 29, 1999.

FIELD OF THE INVENTION

The present invention relates to a method and apparatus for electrochemically-assisted or -augmented mechanical planarization, i.e., electrochemical-mechanical planarization ("EMP"), which method and apparatus enjoy particular utility in the manufacture of semiconductor integrated circuit devices.

BACKGROUND OF THE INVENTION

Chemical-mechanical polishing (CMP) techniques and apparatus therefor have been developed for providing smooth topographies, particularly on the surfaces of layers deposited on semiconductor substrates during integrated circuit manufacture. In such instances, rough topography results when metal conductor lines are formed over a substrate containing device circuitry, e.g., inter-level metallization patterns comprising a plurality of electrically conductive lines which may, inter alia, serve to interconnect discrete devices formed within the substrate. The metal conductor lines are insulated from each other and from vertically adjacent interconnection levels by thin layers of dielectric insulation material, and openings formed through the insulating layers provide electrical interconnection and access between successive such interconnection levels. In fabricating such type devices including multiple interconnection and insulative layers, it is desirable that the metallic and insulative layers have a smooth topography, inasmuch as it is very difficult to photolithographically image and pattern layers applied to rough surfaces. CMP can also be employed for removing different layers of material from the surface of a semiconductor substrate, as for example, following via hole formation in an insulating layer, when a metallization layer is deposited and then CMP is used to form planar metal via plugs embedded in the insulating layer.

Briefly, CMP processes utilized in semiconductor device manufacture involve mounting a thin flat workpiece, e.g., a semiconductor wafer substrate, on a carrier or polishing head, with the surface to be polished being exposed. The substrate surface is then urged against a wetted polishing surface, i.e., a rotating polishing pad, under controlled mechanical pressure, chemical, and temperature conditions. In addition, the carrier head may rotate to provide additional motion between the substrate and polishing pad surfaces. A polishing slurry containing a polishing agent, such as alumina ($Al_2O_3$) or silica ($SiO_2$) finely-dimensioned particles is used as the abrasive material. Additionally, the polishing slurry contains a number of chemicals, including pH adjusting and stabilizing agents, as well as chemical oxidizing agents for chemically removing (i.e., etching) various components of the surface being planarized. The combination of mechanical and chemical removal of surface material during the polishing process results in superior planarization of the polished surface, vis-à-vis other planarization techniques.

Slurries used for CMP can be divided into three categories, depending upon their intended use: silicon (Si) polish slurries, oxide polish slurries, and metal polish slurries. Si polish slurries are designed to polish and planarize bare Si wafers and are typically composed of very small (i.e., about 20–200 nm diameter) abrasive particles, e.g., of silica ($SiO_2$), alumina ($Al_2O_3$), or ceria ($CeO_2$), suspended in a water-based liquid at a somewhat basic pH provided by a pH adjusting agent, typically a hydroxide-type base. Oxide polish slurries are designed to polish and planarize a dielectric layer on a wafer, typically a layer of silicon dioxide ($SiO_2$), and are similarly composed of very small abrasive particles (i.e., about 20–1000 nm diameter) of, e.g., $SiO_2$, $Al_2O_3$, or $CeO_2$, suspended in a water-based liquid at a high (i.e., basic) pH.

Metals polish slurries are designed to polish and planarize conductive layers on semiconductor wafer substrates. The conductive layers are typically deposited on a dielectric layer and typically comprise metals such as tungsten (W), titanium (Ti), aluminum (Al), copper (Cu), alloys thereof, semiconductors such as doped silicon (Si), doped polysilicon, and refractory metal silicides. The dielectric layer typically contains openings ("vias") that are filled with the conductive material to provide a path through the dielectric layer to previously deposited layers. After the conductive layer is polished, only the conductive material filling the vias remains in the dielectric layer.

Metal polish slurries utilized for such CMP of vias typically include very small particles (i.e., about 20–1000 nm diameter) of the above-mentioned abrasive materials, suspended in a water-based liquid. In contrast to the Si and oxide-type polishing slurries, the pH may be acidic (i.e., <5) or neutral and is obtained and controlled by addition of acid(s) or salt(s) thereof. In addition to the organic acid(s) or salt(s), metals polishing slurries include one or more oxidizing agents for assisting in metal dissolution and removal, typically selected from hydrogen peroxide, potassium ferricyanide, ferric nitrate, or combinations thereof.

However, the combination of acidic or neutral pH and presence of oxidizing agent(s), hereafter "oxidizer(s)", in CMP metals polishing slurries can result in several disadvantages, drawbacks, and difficulties, including, inter alia:

(a) the oxidizer can continue to etch the electrically conductive material, e.g., metal, during "static" periods, i.e., periods when mechanical polishing is not being performed but the substrate surface remains in contact with the polishing slurry containing at least one oxidizer, e.g., upon completion of CMP but prior to removal of the substrate surface from contact with the slurry. As a consequence, unwanted static etching of the metallic features of the polished surface can occur, disadvantageously resulting in formation of depressions therein, referred to as "dishing", which phenomenon remains a significant problem in metal CMP processes;

(b) the amount of oxidizer present in the metals polish slurries is not constant during the interval necessary for completion of the CMP processing, but rather varies during the course of CMP as a result of consumption thereof during the metal oxidation process. As a consequence, the concentration of oxidizer in the slurry, hence the rate of metal oxidation, is not controlled throughout processing, unless continuous, reliable detection/concentration measurement and replenishment means are provided, which means undesirably add to the cost of CMP processing;

(c) in some instances, the presence of oxidizer in the metals polishing slurry is particularly undesirable during a specific portion of the CMP processing. For example, the presence of oxidizer in the slurry during the later stage(s) of polishing frequently results in the above-mentioned problem of "dishing", i.e., a height differential between a dielectric oxide layer and metallization features within an array of metallization features, as well as undesirable corrosion and "erosion", i.e., a height differential between a dielectric oxide layer in an open field region and in an array of metallization features; and (d) the presence of oxidizer(s) and spent oxidizer(s), e.g., peroxide, Fe ions, etc., in spent (i.e., waste) abrasive slurry adds to the complexity, problems, and expense associated with handling and disposal of the waste slurry in an environmentally acceptable manner.

U.S. Pat. No. 4,839,005 discloses a method and apparatus for providing mirror-smooth finishes to aluminum surfaces by applying a constant anodic potential to the surface via a passivation-type electrolyte solution, while simultaneously performing mechanical polishing thereof with an abrasive slurry or cloth. While such electrolytically-assisted polishing may dispense with the requirement for a chemical oxidizer in the polishing slurry or abrasive cloth, the application of a constant anodic potential renders the disclosed method/apparatus unsatisfactory for use in the planarization of workpieces comprising semiconductor wafers with surfaces having electrically conductive wirings, etc., in that undesirable dishing would still occur during the late stage(s) of planarization due to excessive, electrochemically promoted anodic metal dissolution, as in the conventional methodology employing chemical oxidizing agent(s).

Accordingly, there exists a need for a simplified and reliable method and apparatus for performing planarization processing, particularly of semiconductor wafer substrates comprising surfaces including metallization patterns on or within a dielectric material layer, which method and apparatus are free of the disadvantages and drawbacks associated with the conventional CMP methodologies, and are fully compatible with the economic and product throughput requirements of automated semiconductor manufacture processing.

The present invention addresses and solves the above-described problems attendant upon the manufacture of integrated circuit semiconductor and other electrical and electronic devices according to conventional CMP methodology utilizing abrasive slurries containing chemical oxidizer agent(s), and is fully compatible with all other mechanical aspects of CMP-type planarization processing.

DISCLOSURE OF THE INVENTION

An aspect of the present invention is an improved method of planarizing workpiece surfaces comprising an electrically conductive material.

Another aspect of the present invention is an improved method of planarizing a workpiece surface by means of an electrochemical-mechanical planarization (EMP) process and apparatus utilizing an abrasive slurry free of chemical oxidizing agent(s).

Yet another aspect of the present invention is an improved method of controllably planarizing a workpiece surface.

Still another aspect of the present invention is an improved method of controllably planarizing a semiconductor substrate surface comprising a pattern of electrical conductors.

A still further aspect of the present invention is improved apparatus for controllably performing EMP of at least one surface of at least one workpiece.

A yet another aspect of the present invention is improved apparatus for performing EMP of a workpiece surface with an oxidizer-free abrasive slurry.

Additional aspects and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are achieved in part by a method of planarizing a surface of a workpiece by electrochemical-mechanical planarization (EMP), which method comprises the steps of:

(a) providing a chemical-mechanical polishing (CMP) apparatus with at least one workpiece having at least one surface to be planarized by EMP;

(b) supplying the CMP apparatus with an electrolytically conductive fluid free of chemical oxidizing agent(s); and (c) planarizing the at least one workpiece surface by EMP utilizing the CMP apparatus, the planarizing by EMP including applying a time-varying electrochemical potential to the at least one workpiece surface.

In embodiments according to the present invention, step (c) comprises performing EMP by controllably applying a time-varying anodic potential to the at least one workpiece surface. In particular embodiments according to the present invention, step (c) comprises applying a first, higher anodic potential during an initial stage of the EMP and applying a second, lower anodic potential at or during a later stage of the EMP; or step (c) comprises reducing the first, higher anodic potential to the second, lower anodic potential during an intermediate stage of the EMP, e.g., continuously reducing the anodic potential during the intermediate stage; or step (c) comprises rapidly reducing the anodic potential from the first, higher potential to the second, lower potential after a predetermined interval at the first, higher potential.

According to further embodiments of the present invention, step (c) comprises applying the time-varying electrochemical potential from a controllably variable DC power supply, e.g., an electronic potentiostat; and a further step (d) comprises monitoring the extent of the EMP of the at least one workpiece surface in order to determine the end-point thereof. According to particular embodiments of the present invention, step (d) comprises coulometrically monitoring the extent of EMP, or step (d) comprises monitoring a signal from a sensor utilized for measuring a physical property (e.g., electrical resistance or conductance)) or optical property (e.g., reflectance) of the at least one workpiece surface.

According to yet further embodiments of the present invention, step (a) comprises providing a semiconductor wafer substrate as the workpiece, the semiconductor wafer substrate comprising the at least one workpiece surface and including a pattern of electrical conductors formed on or within a layer of a dielectric material; and step (b) comprises supplying the CMP apparatus with an oxidizer-free, electrolytically conductive, abrasive slurry comprising finely-dimensioned abrasive particles and at least one pH adjusting agent.

According to still further embodiments according to the present invention, step (a) comprises providing a CMP apparatus having a non-abrasive polishing pad and step (b) comprises supplying the CMP apparatus with an oxidizer-free, electrolytically conductive fluid comprising an abrasive slurry comprising finely-dimensioned abrasive particles; or step (a) comprises providing a CMP apparatus having an abrasive polishing pad and step (b) comprises supplying the CMP apparatus with an oxidizer-free, electrolytically conductive fluid comprising a non-abrasive liquid; or step (a) comprises providing a CMP apparatus having a non-abrasive polishing pad and step (b) comprises supplying the CMP apparatus with an oxidizer-free, electrolytically conductive fluid comprising a non-abrasive liquid.

According to another aspect of the present invention, apparatus for performing electrochemical-mechanical planarization (EMP) of at least one surface of at least one workpiece comprise:

(a) a device adapted for performing chemical-mechanical polishing (CMP) of the at least one workpiece surface; and (b) a power supply connected to the CMP-adapted device for providing a controllable, time-varying DC electrochemical potential to the at least one workpiece surface for effecting EMP thereof.

In embodiments according to the present invention, the device (a) adapted for performing CMP of at least one workpiece surface comprises an abrasive polishing pad or a non-abrasive polishing pad; power supply (b) comprises an electronic potentiostat adapted for applying a time-varying, anodic electrochemical potential to the at least one workpiece surface; and the apparatus further comprises a device (c) for monitoring the extent of EMP of the at least one workpiece surface for determining the end-point thereof. According to particular embodiments of the present invention, the monitoring device (c) comprises a coulometer or a sensor for providing a signal indicative of a physical (e.g., electrical) or optical property of the at least one workpiece surface.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are capable of modification in various obvious respects, all without departing from the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, wherein.

DESCRIPTION OF THE INVENTION

Figure 1:
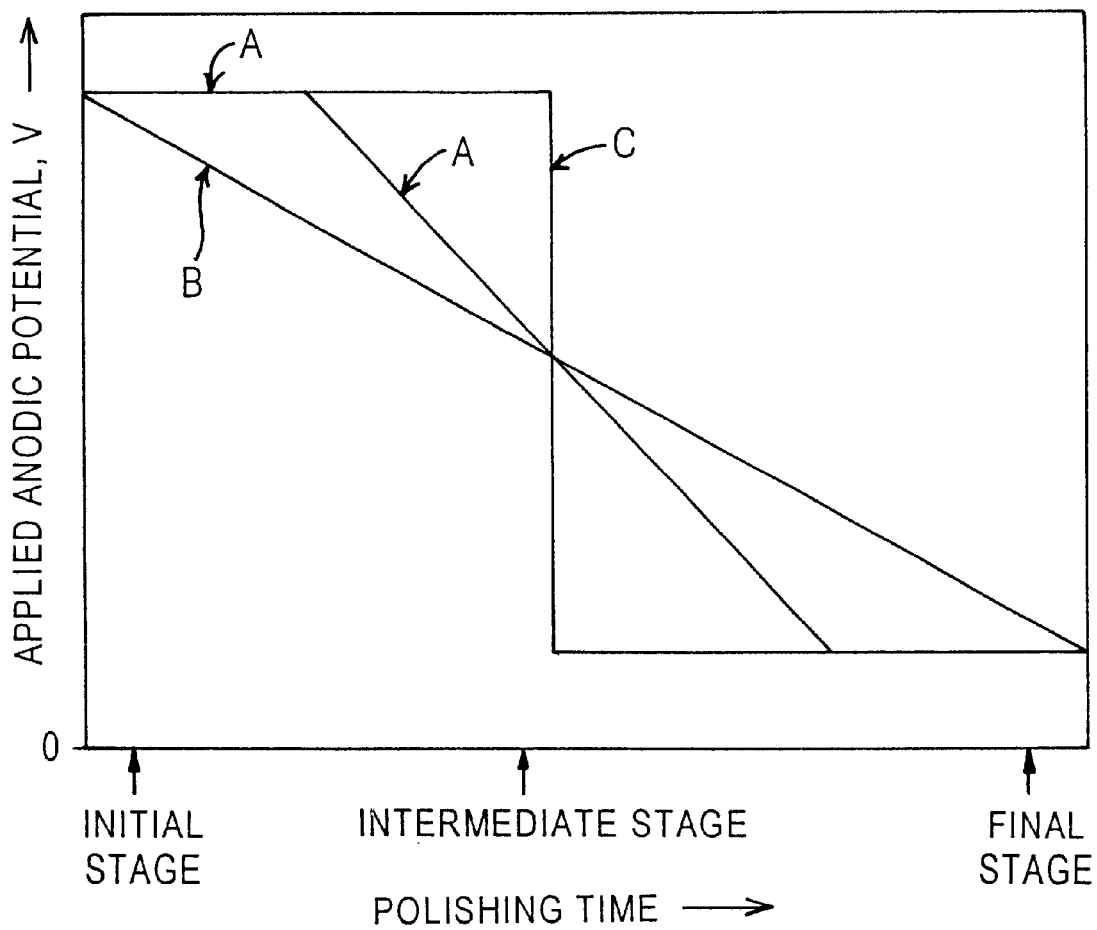
FIG. 1 is a graph illustrating several examples of anodic potential vs. time profiles usable according to the practice of the present invention.

The present invention is based upon the discovery that electrochemical-mechanical planarization (EMP) processing of workpiece surfaces, e.g., semiconductor wafer substrates having electrically conductive patterns formed therein or thereon, such as are utilized in integrated semiconductor device manufacture, can be performed in chemical-mechanical polishing apparatus having abrasive or non-abrasive polishing pads and appropriately modified to apply a time-varying electrochemical potential to the workpiece surface, i.e., an anodic potential, and wherein oxidizer-free fluids such as abrasive slurries or non-abrasive liquids are utilized, thereby, inter alia, advantageously eliminating problems of dishing and corrosion as are commonly encountered during static periods and in the later stages of conventional CMP planarization processing.

Briefly stated, according to the present invention, instead of effecting metals dissolution/removal by means of chemical oxidizer agent(s), an anodic electrochemical potential is applied to the surface being polished, which surface includes a pattern of metal conductors, and the abrasive slurry or non-abrasive liquid supplied to the apparatus is free of chemical oxidizer(s). The applied anodic electrochemical potential is advantageously controlled by means of a programmable electronic potentiostat, whereby potential control is easy and precise. During the initial stage(s) of the polish, a relatively high anodic potential is applied to the metal-bearing workpiece surface to promote relatively aggressive (i.e., high rate) oxidation/dissolution/removal of the metal pattern. When polishing is at a later stage, e.g., when approaching an underlying barrier layer, such as of tantalum (Ta), the applied anodic potential is reduced to a level producing substantially less aggressive (i.e., low or negligibly low rate) oxidation/dissolution/removal of the metal features, thereby eliminating or substantially reducing static etching and resultant dishing, corrosion, and erosion as encountered with conventional CMP processing.

According to the present invention, the application of a time-varying anodic electrochemical potential to the workpiece surface for assisting in metals dissolution/removal, i.e., as a replacement for the chemical oxidizer agent(s) present in conventional CMP metals polishing slurries, entails a number of advantages vis-à-vis the latter, including the following:

a. the concentration of chemical oxidizers in metals polishing slurries utilized in conventional CMP planarization processing, hence the rate of metals oxidation/dissolution, is not easily controlled during polishing, whereas, according to the present invention, the level of the anodic electrochemical potential applied to the workpiece surface, which level determines the rate of metals oxidation/dissolution, is readily adjustable and controllable with great precision;

b. in conventional metals polishing/planarization by CMP, the presence of chemical oxidizer(s) during the late stages of polishing causes problems of dishing, corrosion, and erosion, particularly during static periods after completion of polishing but prior to removal of the workpiece surface from contact with the abrasive slurry. However, according to an advantageous feature of the present invention, the applied anodic potential during the later stage(s) of the polishing/planarization processing can be reduced to a desired low level whereat metals dissolution occurs only at a negligibly low rate, thereby eliminating problems of dishing, corrosion, and erosion;

c. in conventional metals polishing/planarization by CMP, the rate of polishing/planarization is strongly dependent upon chemical and kinetic factors, e.g., the particular oxidizer species and concentration thereof, temperature, diffusion of reactants and products, etc., whereas, according to the present invention employing EMP methods and apparatus, workpiece throughput can be significantly increased over that obtainable by conventional CMP techniques by application of high levels of anodic electrochemical potential during the early stage(s) of polishing, whereby aggressive metals dissolution/removal rates can be obtained;

d. inasmuch as the cost of the necessary electrical current according to the present invention is substantially lower than that of equivalent quantities of chemical oxidizer (s), EMP processing is economically favorable vis-à-vis conventional CMP processing; and e. the absence of oxidizing agents (e.g., peroxides, cyanides, Fe ions) in spent slurry or non-abrasive liquid simplifies waste handling according to environmentally acceptable standards.

Referring now to FIG. 1, illustrated therein, by way of illustration but not limitation, are several examples of applied anodic potential vs. time profiles suitable for use in the present invention. However, given the present disclosure and objectives of the present invention, it is considered within the scope of ordinary variation to determine other profiles for use in a given application. Further, while the illustrated and other possible anodic voltage vs. time profiles are best obtained by means of a conventional 3-electrode (i.e., working, reference, and counter electrodes), programmable electronic potentiostat system, a programmable 2-electrode (i.e., working and counter electrodes) power supply may be employed where less precise control of the applied anodic potential is satisfactory.

Curve A of FIG. 1 illustrates a case where a relatively high, constant anodic potential is first applied to the workpiece surface for a specific interval during the initial polishing stage in order to promote aggressive, i.e., high rate, metal oxidation/dissolution/removal as to reduce overall processing time and increase product throughput, followed by a linear decrease in applied anodic potential during an intermediate polishing stage to a preselected relatively low anodic potential providing a low or negligible metals dissolution rate, followed in turn by maintenance of the relatively low anodic potential during the final polishing stage.

By contrast, curve B of FIG. 1 illustrates a case where the initial, relatively high, anodic potential applied at the initial polishing phase is continuously reduced during the entire polishing interval to the relatively low level achieved during the final polishing stage. Curve C of FIG. 1 illustrates yet another case where the initial, relatively high anodic potential is maintained constant for a predetermined interval and then rapidly reduced to the relatively low level for the remainder of the polishing process.

As should be readily apparent, a large number and variety of applied anodic potential vs. time profiles are usable within the context and spirit of the present invention. Moreover, the specific voltage levels, intervals, rates of decrease, etc., are readily optimized by one of ordinary skill for use in a particular application, e.g., depending upon the particular metal(s) to be polished/planarized and the thicknesses thereof.

Figure 2:
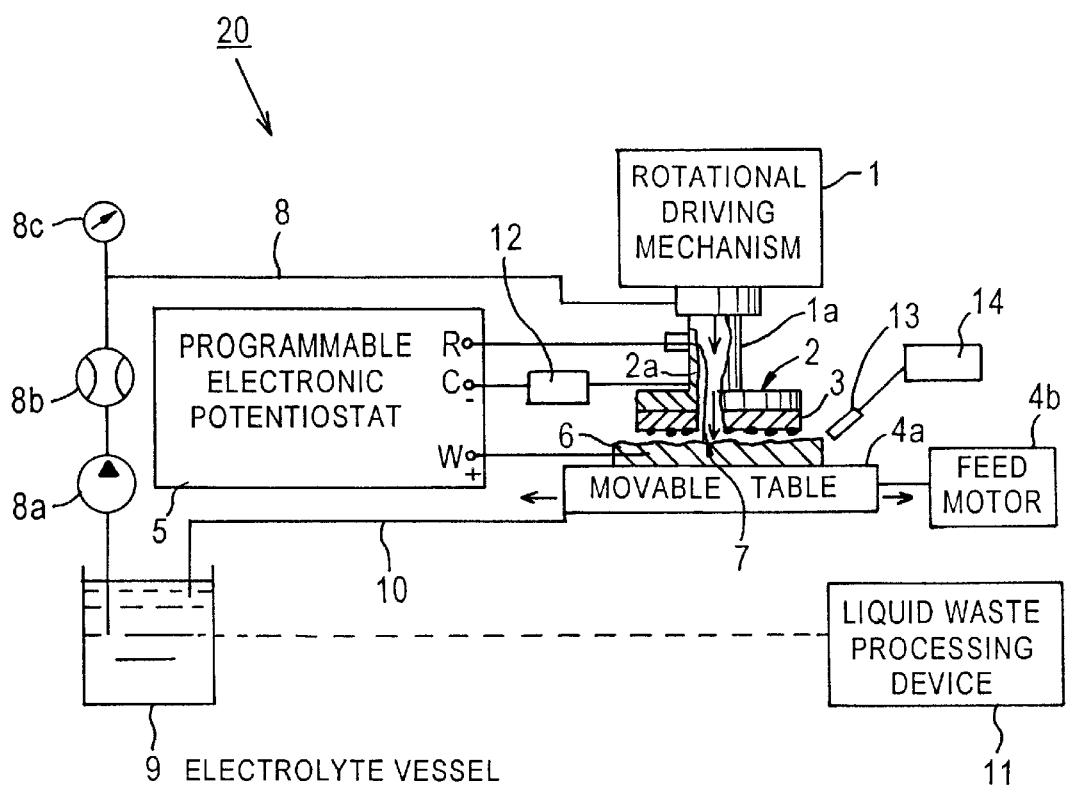
FIG. 2 illustrates, in simplified cross-sectional schematic form, an embodiment of an electrochemical-mechanical planarization (EMP) apparatus according to the present invention.

FIG. 2 schematically illustrates, in simplified cross-sectional form, an embodiment of an apparatus according to the present invention, comprising a CMP-type apparatus modified to perform EMP processing. As illustrated, apparatus 20 comprises a rotational driving mechanism 1 for rotating shaft 1a, which shaft in turn rotates tool electrode 2 formed of an electrochemically inert metal or metal alloy. Tool electrode 2 is disc-shaped and mounts on the lower surface thereof a liquid-permeable, non-conductive, polishing pad 3. Rotational driving mechanism 1 is adapted to provide a predetermined downwardly urging pressure of the polishing pad 3 during rotation. An abrasive slurry/liquid electrolyte supply 2a conduit is formed within the central elongated portion of tool electrode 2 and the center of polishing pad 3 and includes a plurality of radially extending channels formed within the lower pad surface for evenly supplying the liquid-permeable polishing pad 3 and the space therebelow with slurry/electrolyte. Tool electrode 2 is electrically connected to the counter-electrode terminal C of programmable electronic potentiostat 5 and typically is negatively (i.e., cathodically) biased during polishing/planarization processing.

Movable table 4a mounting a workpiece 6 on its upper surface in facing relation to the lower surface of polishing pad 3 is disposed below the tool electrode 2, and is reciprocated by means of feed motor 4b and associated mechanism, leftwardly and rightwardly as shown in the figure. At least the upper surface of workpiece 6 comprising a pattern of electrical, e.g., metal, conductors therein or thereon is electrically connected to the working electrode terminal W of potentiostat 5 and typically is positively (i.e., anodically) biased during polishing/planarization processing. A reference electrode 7, typically formed of an inert metal, e.g., platinum (Pt), or of Ag/AgCl, is electrically connected to the reference electrode terminal R of potentiostat 5 and extends through the slurry/electrolyte supply conduit 2a of tool electrode 2, whereby the exposed tip thereof is positioned in close proximity to the upper surface of workpiece 6.

A slurry/electrolyte supply conduit 8 is connected to a slurry/electrolyte supply vessel or reservoir 9 for supplying an oxidizer-free, abrasive particle-containing, slurry/electrolyte between the polishing pad 3 and the upper surface of workpiece 6. A supply pump 8a, flow meter 8b, and pressure gage 8c are disposed between supply conduit 8 and supply vessel 9. The slurry/electrolyte is supplied from the supply vessel 9 by way of the supply conduit 8 and fed through the slurry/electrolyte supply conduit 2a to be between the polishing pad 3 and the upper surface of workpiece 6, and is returned to supply vessel 9 by way of return conduit 10. A slurry/liquid waste processing device 11 is optionally provided for disposal of spent slurry/electrolyte after excessive accumulation therein of dissolved metal(s) from workpiece 6.

Electronic potentiostat 5 is provided with internal or external programming means (not shown for illustrative simplicity), as are conventional in the art, for supplying any of a variety of desired anodic potential vs. time profiles to workpiece 6. As previously indicated, a programmable 2-electrode DC power supply can be utilized in the event less precise control of the applied anodic voltage is acceptable. Moreover, a coulometer 12 can be provided in either the working or counter-electrode supply lines for determining an end-point of EMP processing, e.g., when a predetermined amount of current flow indicating a predetermined amount of metal dissolution, has occurred. Alternatively, a sensor 13, positioned adjacent the upper, polished surface of workpiece 6 and operatively connected to a measuring device 14 may be utilized for determining an end-point of EMP by measuring and/or detecting a change in a physical (e.g., electrical) or optical property thereof.

Figure 3:
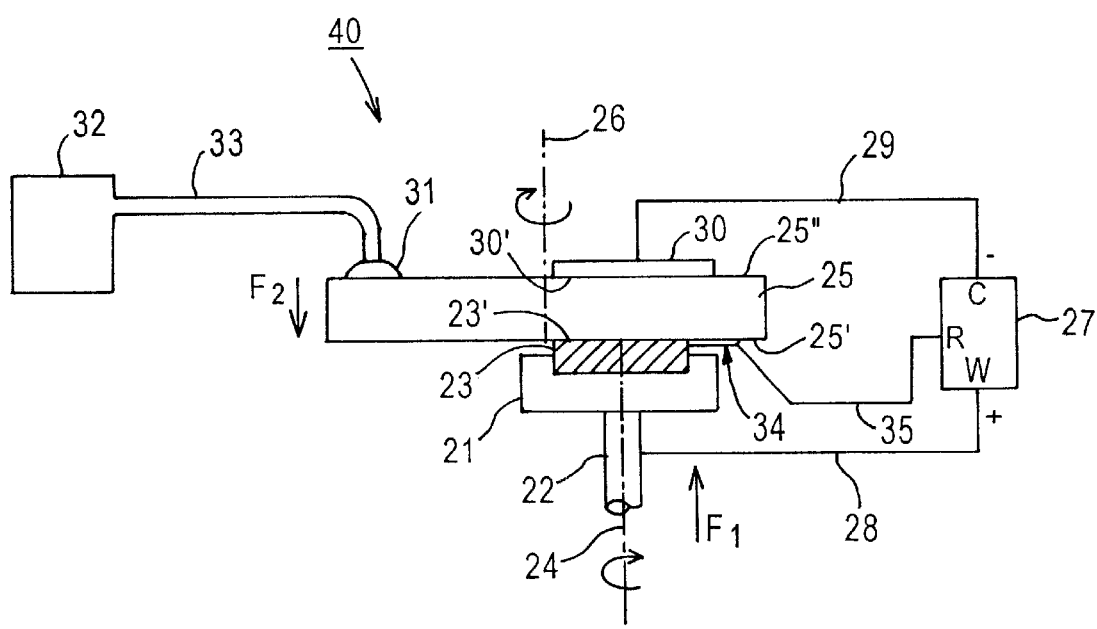
FIG. 3 illustrates, in simplified cross-sectional schematic form, another embodiment of another EMP apparatus according to the present invention.

FIG. 3 schematically illustrates, in simplified cross-sectional form, another embodiment of an EMP apparatus according to the present invention. Apparatus 40 resembles known apparatus for performing CMP of workpiece substrates such as semiconductor wafers, and comprises, in pertinent part, a workpiece holder 21 connected at its underside to shaft 22 for rotation of a workpiece 23 (e.g., a semiconductor wafer having at least one electrical, i.e., metal, conductor formed in or on the upwardly facing surface 23' thereof) about a central axis 24, while urging the upwardly facing workpiece surface 23' with force $F_1$ against the downwardly facing surface 25' of porous electrolyte applicator/polishing pad. Electrolyte applicator/polishing pad 25 is adapted (by means not shown for illustrative simplicity) for rotating about a central axis 26 in a direction counter to that of workpiece holder 21 while urging downwardly facing surface 25' with force $F_2$ against upwardly facing workpiece surface 23'. Apparatus 40 further includes a programmable electronic potentiostat 27, of conventional type, the working electrode terminal W (typically of positive polarity) being operatively connected by line 28 to rotatable shaft 22 for establishing anodic electrochemical conditions at workpiece surface 23'. The counter-electrode terminal C (typically of negative polarity) of electronic potentiostat 27 is operatively connected by line 29 to electrochemically inert counter-electrode 30 located on the upwardly facing surface 25" of electrolyte applicator/polishing pad 25, for establishing cathodic electrochemical conditions at the downwardly facing surface 30' thereof. In the illustrated embodiment, the tip of a reference electrode 34, typically of an inert metal, e.g., Pt, is positioned in close proximity to the workpiece surface 23' in the narrow, electrolyte-filled space between the lower surface 25' of the applicator/polishing pad 25 and the workpiece upper surface 23' and is operatively connected to the reference electrode terminal R of potentiostat 27 via line 35. However, it is within the ambit of the present invention to provide other physically configured arrangements for positioning the tip of the reference electrode in electrolyte in close proximity to the workpiece upper surface 23'. A spray of an oxidizer-free slurry/electrolyte 31 comprising abrasive particles of sufficiently small dimension as to pass freely through the porous electrolyte applicator/polishing pad 25 is supplied to the upwardly facing surface 25" of the pad from slurry/electrolyte reservoir 32 by means of supply conduit 33, for replenishing consumed slurry/electrolyte 31 and maintaining the pores of the electrolyte applicator/polishing 25 pad in a filled state.

As in the embodiment illustrated in FIG. 2, the embodiment of FIG. 3 may employ a 2-electrode programmable DC power supply if diminished precision of anodic potential control is acceptable in a particular situation, thereby dispensing with the need for reference electrode 34 and its associated positioning means. In addition, a coulometer may be electrically positioned in either the working electrode or counter-electrode circuit for providing end-point indication, as in the earlier embodiment. Finally, a sensor and measuring means for determining a physical (e.g., electrical) or optical property of the polished surface for determining the end-point of EMP processing may also be provided, as in the earlier embodiment.

Figure 4:
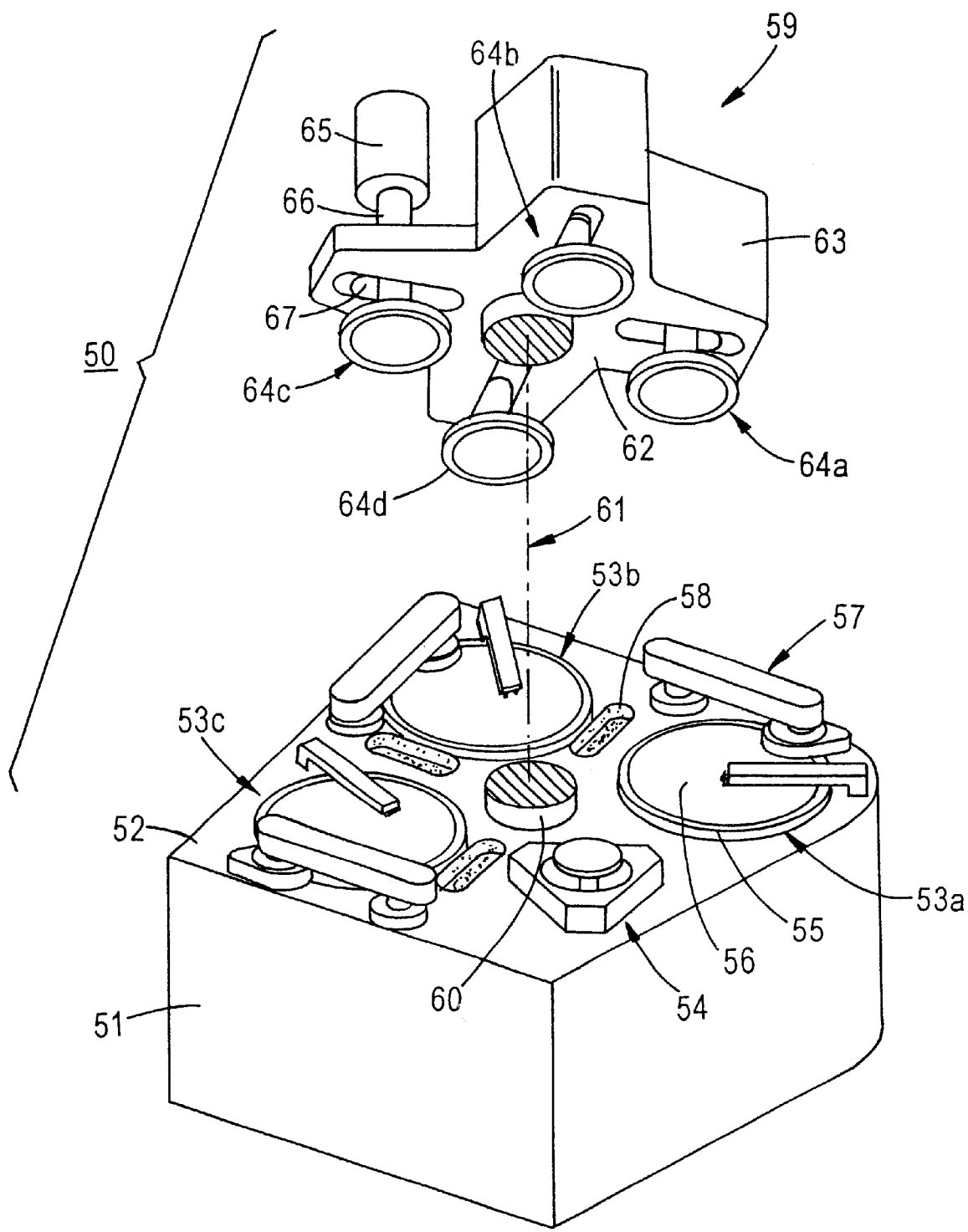
FIG. 4 illustrates, in exploded perspective view, yet another embodiment of an EMP apparatus according to the present invention.
Figure 5:
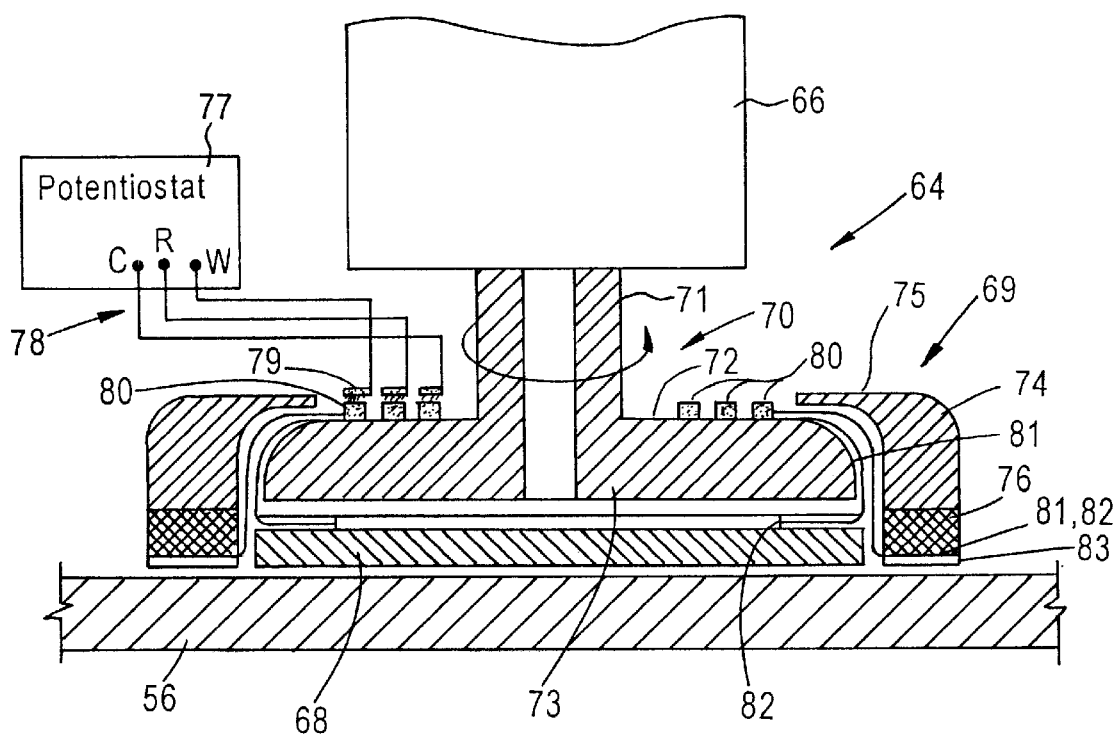
FIG. 5 illustrates, in simplified cross-sectional schematic form, a portion of the EMP apparatus of FIG. 4.
Figure 6:
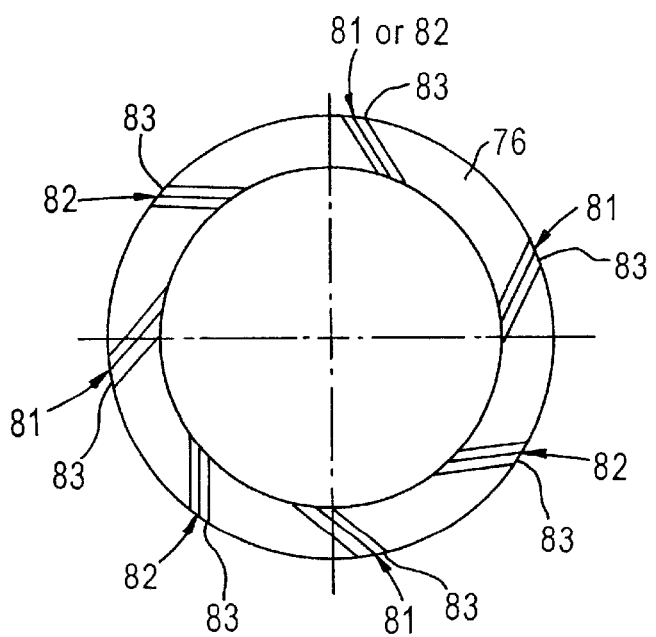
FIG. 6 illustrates, in simplified form, a plan view of a retaining ring of the EMP apparatus of FIG. 4.

Referring now to FIGS. 4–6, illustrated therein is yet another embodiment of an EMP apparatus according to the present invention, which apparatus is a of a multi-station type such as is employed in automated semiconductor manufacture. With particular reference to FIG. 1, illustrated therein in schematic, exploded view, is a multi-station CMP apparatus 50 including a lower machine base 51 having an upper table surface 52 and a removable upper cover (not shown). As shown, upper table surface 52 supports thereon a plurality of chemical-mechanical polishing stations 53a, 53b, and 53c and a transfer station 54 which serves for providing a plurality of functions, including, inter alia, receiving substrates from a loading apparatus (not shown for illustrative simplicity), washing the substrates, loading the substrates onto carrier heads, receiving polished substrates, and transferring the polished substrates back to the loading apparatus.

Each polishing station 53a, 53b, and 53c includes a rotatable platen 55 on which is mounted a polishing pad 56 and each of the polishing stations may further include an associated pad conditioner apparatus 57 for maintaining the condition of the respective polishing pad so that it will effectively polish a substrate pressed against it while rotating. Intermediate washing stations 58 are positioned between neighboring polishing stations 53a, 53b, 53c and transfer station 54 for rinsing substrates as they pass from one polishing station to another.

Positioned above the lower machine base 51 is a rotatable multi-head carousel 59, supported by a center post 60 located on the upper table surface 52 and adapted for rotation about carousel axis 61 by means of a motor located within base 51. The center post 60 supports a carousel base plate 62 and associated cover 63. The multi-head carousel 59 includes a plurality of head systems 64, illustratively four, i.e., 64a, 64b, 64c, and 64d. Three of the carrier head systems mount thereon a substrate, and polish the respective surface thereof by pressing it against an opposing polishing pad 56 mounted on the platen 55 of polishing stations 53a, 53b, and 53c. One of the carrier head systems receives substrates from, and delivers substrates to, transfer station 54.

Typically, the four carrier head systems 64a–64d are mounted on the carousel base plate 62 at equidistant intervals about the carousel rotational axis 61. Center post 60 supports carousel base plate 62 and allows the carousel motor to rotate the carousel base plate 62 and to orbit the carrier head systems 64a–64d, and the substrates mounted thereon, about carousel axis 61. Each of the carrier head systems 64a–64d includes a polishing or carrier head (shown in more detail in FIG. 5), which carrier rotates about its own rotational axis via a respective motor 65 coupled to drive shaft 66, and independently laterally oscillates in a radially extending slot 67 formed in the carousel base plate 62.

FIG. 5 illustrates, in schematic, cross-sectional view, one of the carrier head systems 64a–64d in operative position facing a polishing pad 56 of a polishing station 53 for polishing/planarization of a wafer substrate 68, which carrier head system is adapted for performing electrochemical-mechanical planarization (EMP) according to the present invention. As shown therein, rotatable drive shaft or spindle 66 is operatively connected to rotating polishing head assembly 69 comprising a circularly-shaped, inner mounting piece 70 having a narrow, shaft-like axially extending upper portion 71 connected to drive shaft 66 and a wide lower portion 72 having a non-conductive membrane 73 on its lower surface for mounting wafer substrate thereon, and an outer, annularly-shaped mounting piece 74 having an inwardly extending flange portion 75 at its upper end and an annularly-shaped retaining ring 76 at its lower end.

According to the present invention, the CMP apparatus 50, as described supra, is modified, as in the previous embodiments, to provide for controlled application of a time-varying electrochemical potential, e.g., a variable anodic potential, to wafer substrate 68 for performing EMP processing. Accordingly, programmable electronic potentiostat 77 having working (w), counter (c), and reference (r) electrode outputs is operatively connected to the polishing head assembly 69 by means of respective electrical leads 78, brush-type electrical contactors 79, and concentric contact rings 80 formed on the upper surface of the wide lower portion 72 of mounting piece 70. Respective electrical leads connected to contact rings 80 are connected to an annularly-shaped electrical contact located between insulative membrane 73 and the rear surface of wafer substrate 68, inwardly of the wafer circumference, for permitting functioning of the wafer as a working (w) electrode, and to an alternating plurality of counter electrodes 81 (e.g., of an electrochemically inert, electrically conductive material such as Pt or C) and reference electrodes 82 (e.g., of Pt or Ag/AgCl) positioned in grooved recesses 83 formed in the lower surface of retaining ring 76, as shown in greater detail in FIG. 6.

As in the previous embodiments, the reference electrodes 82 may be dispensed with, if desired, and a 2-electrode programmable DC power supply utilized in place of the 3-electrode potentiostat 77 of the illustrated embodiment, provided reduced precision of control of anodic potential applied to the wafer substrate 68 is acceptable in a particular situation. Moreover, as before, a coulometer may be electrically positioned in either the working electrode or counter-electrode circuit for providing end-point indication/detection. Alternatively, a sensor and measuring means for determining a physical property (e.g., electrical resistance as determined by a conventional 4-contact probe device) or an optical property of the polished surface (e.g., reflectance as indicated by means of a conventional light source/photocell apparatus) for determining the end-point of EMP processing may also be provided, as in the previously described embodiments.

A number of advantages are thus provided by the present invention, including, but not limited to, substantial reduction or elimination of undesirable dishing and erosion in planarization of semiconductor wafer surfaces comprising electrically conductive patterns, elimination of chemical oxidizers from waste slurry streams, reduced cost, improved control of planarization, and increased manufacturing throughput for economic competitiveness. Moreover, the present invention is advantageously fully compatible with all aspects of conventional process technology, e.g., CMP processing of semiconductor wafers utilized in integrated circuit semiconductor device manufacture. In addition, the inventive concept disclosed herein may be applied to CMP processing and apparatus therefor which do not employ abrasive slurries, e.g., where an abrasive or non-abrasive polishing/planarizing pad is employed in combination with an electrolytically conductive, non-abrasive particle-containing liquid.

In the previous descriptions, numerous specific details are set forth, such as particular materials, structures, reactants, processes, etc., in order to provide a thorough understanding of the present invention. However, it should be recognized that the present invention can be practiced without resorting to the details specifically set forth. For example, the present invention is applicable to planarization of a variety of substrates, including, but not limited to semiconductor wafers and electronic circuit board manufacture. In other instances, well-known processing structures and techniques have not been described in detail in order not to unnecessarily obscure the present invention.

Only the preferred embodiments of the present invention are shown and described herein. It is to be understood that the present invention is capable of changes and/or modifications within the scope of the inventive concept as expressed herein.

What is claimed is:

1. A method of planarizing a surface of a workpiece by electrochemical-mechanical planarization (EMP), comprising:

(a) providing a chemical-mechanical polishing (CMP) apparatus with at least one workpiece having at least one surface to be planarized by EMP;

(b) supplying said CMP apparatus with an electrolytically conductive fluid free of chemical oxidizing agent(s); and (c) planarizing the at least one workpiece surface by EMP utilizing said CMP apparatus, said planarizing by EMP including applying a time-varying electrochemical potential to the at least one workpiece surface;

wherein step (c) comprises performing said EMP by controllably applying a time varying anodic potential to said at least one workpiece surface, wherein the time varying anodic potential comprises applying a first, higher anodic potential to said workpiece surface during an initial stage of said EMP and applying a second, lower anodic potential to said workpiece surface during a later stage of said EMP.

2. The method according to claim 1, wherein:

step (c), comprises reducing said first, higher anodic potential to said second, lower anodic potential during an intermediate stage of said EMP.

3. The method according to claim 1, wherein:

step (c) comprises continuously reducing said anodic potential during said intermediate stage.

4. The method according to claim 1, wherein:

step (c) comprises rapidly reducing said anodic potential from said first, higher potential to said second, lower potential.

5. A method for electrochemically and mechanically planarizing a surface of a substrate, comprising:

holding a substrate against a polishing pad of a polishing device;

applying a first, higher potential between the polishing pad and the surface of the substrate being planarized during an initial stage of said EMP;

applying a second, lower potential between the polishing pad and the surface of the substrate being planarized during a later stage of said EMP; and delivering a polishing fluid between the polishing pad and the surface of the substrate, the polishing fluid containing no chemical oxidizing agents.

* * * * *